United States Patent
Chang et al.

(10) Patent No.: US 9,074,043 B2
(45) Date of Patent: Jul. 7, 2015

(54) COMPOUND FOR CARRIER TRANSPORT, ELEMENT AND ELECTRONIC DEVICE USING THE SAME

(75) Inventors: Feng-Chih Chang, Hsinchu (TW); Yu-Lin Chu, Hsinchu (TW); Chih-Chia Cheng, Yunlin County (TW)

(73) Assignees: HARVATEK CORPORATION, Hsinchu (TW); Tzeng-Feng Liu, Hsinchu (TW)

( * ) Notice: Subject to any disclaimer, the term of this patent is extended or adjusted under 35 U.S.C. 154(b) by 152 days.

(21) Appl. No.: 13/588,981

(22) Filed: Aug. 17, 2012

(65) Prior Publication Data
US 2014/0051826 A1 Feb. 20, 2014

(51) Int. Cl.
H01L 51/50 (2006.01)
C08G 61/12 (2006.01)
H01L 51/00 (2006.01)

(52) U.S. Cl.
CPC .............. *C08G 61/12* (2013.01); *H01L 51/006* (2013.01); *H01L 51/0072* (2013.01); *H01L 51/0035* (2013.01); *H01L 51/5088* (2013.01); *C08G 61/124* (2013.01); *C08G 2261/135* (2013.01); *C08G 2261/143* (2013.01); *C08G 2261/1432* (2013.01); *C08G 2261/149* (2013.01); *C08G 2261/3162* (2013.01); *C08G 2261/3241* (2013.01); *C08G 2261/411* (2013.01); *C08G 2261/512* (2013.01); *C08G 2261/91* (2013.01); *C08G 2261/92* (2013.01); *C08G 2261/94* (2013.01); *C08G 2261/95* (2013.01); *Y02E 10/549* (2013.01)

(58) Field of Classification Search
CPC .............. H01L 51/0072; H01L 51/006; H01L 51/0059
USPC ..................... 257/40; 528/367, 423
See application file for complete search history.

(56) References Cited

U.S. PATENT DOCUMENTS

| | | | |
|---|---|---|---|
| 6,353,083 B1 | 3/2002 | Inbasekaran et al. | |
| 6,376,655 B1 * | 4/2002 | Berg et al. | 534/573 |
| 6,852,831 B2 | 2/2005 | Reuter | |
| 7,345,141 B2 | 3/2008 | Mizusaki et al. | |
| 8,450,604 B2 | 5/2013 | Lutsen et al. | |
| 2006/0217492 A1 * | 9/2006 | Mizusaki et al. | 525/330.3 |
| 2007/0225477 A1 | 9/2007 | Lewis et al. | |

FOREIGN PATENT DOCUMENTS

| | | |
|---|---|---|
| CN | 1381543 A | 11/2002 |
| CN | 1687066 A | 10/2005 |
| JP | 2002536492 A | 10/2002 |
| JP | 2003301033 A | 10/2003 |
| JP | 2003221447 A | 8/2004 |
| JP | 2006257196 A | 9/2006 |
| JP | 2009530486 A | 8/2009 |
| JP | 2009283509 A | 12/2009 |
| JP | 2012102286 A | 5/2012 |
| JP | 2011526420 A | 8/2012 |

OTHER PUBLICATIONS

USPTO structure search, Mar. 2015.*
Jiang et al., Perfluorocyclobutane-Based Arylamine Hole-Transporting Materials for Organic and Polymer Light-Emitting Diodes, Advanced Functional Material, 2002, vol. 12, No. 11-12, pp. 745-751.
Niu et al., Crosslinkable Hole-Transport Layer on Conducting Polymer for High-Efficiency White Polymer Light-Emitting Diodes, Advanced Material, 2007, vol. 19, pp. 300-304.
Shao et al., Long-Lifetime Polymer Light-Emitting Electrochemical Cells Fabricated with Crosslinked Hole-Transport Layers, Advanced Materials, 2009, vol. 21, pp. 1972-1975.
Koh et al., Optical Outcoupling Enhancement in Organic Light-Emitting Diodes: Highly Conductive Polymer as a Low-Index Layer on Microstructured ITO Electrodes, Advanced Materials, 2010, vol. 22, pp. 1849-1853.
Chu et al., A New Supramolecular Hole Injection/Transport Material on Conducting Polymer for Application in Light-Emitting Diodes, Advanced Materials, 2012, pp. 1-5.
Cheng et al., Biocomplementary Interaction Behavior in DNA-Like and RNA-Like Polymers, Journal of Polymer Science: Part A: Polymer Chemistry, 2009, vol. 47, pp. 6388-6395.
Kim et al., Poly(3,4-ethylenedioxythiophene) Derived from Poly(ionic liquid) for Use as Hole-Injecting Material in Organic Light-Emitting Diodes, Macromolecular Rapid Communications, 2009, vol. 30, pp. 1477-1482.
Cheng et al., Hierarchical Structure Formed from Self-complementary Sexuple Hydrogen-bonding Arrays, RSC Advances, 2011, vol. 1, pp. 1190-1194.

* cited by examiner

*Primary Examiner* — Gregory Listvoyb
(74) *Attorney, Agent, or Firm* — Li & Cai Intellectual Property (USA) Office

(57) ABSTRACT

The present invention provides a compound of formula I

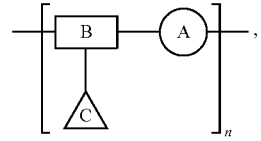

formula I wherein A, B and C are a repeating unit; each of A and B is an optionally substituted group for forming a conjugated polymer; C is a crosslinkable group; and n is an integer equal to or greater than 1. The present invention further provides an element and an electronic device using the compound of formula I, and more particularly, provides a light emitting diode (LED) device using the compound of formula I.

10 Claims, 9 Drawing Sheets

COMPOUND FOR CARRIER TRANSPORT, ELEMENT AND ELECTRONIC DEVICE USING THE SAME

FIELD OF THE INVENTION

The present invention relates to a novel compound for carrier transport, particularly, to an element and electronic device using the novel compound, and more particularly, to a LED device using the novel compound.

BACKGROUND OF THE INVENTION

Organic and polymer light-emitting diodes (OLED and PLED) have drawn considerable attention because of their low power consumption, light weight, fast response and wide viewing angle. Charge transport is an important factor with regard to the performance of these devices. For high-performance LED devices, charge injection and transport from both anode and cathode must be balanced off by excitons formed in a light emission layer. Generally, LED devices include three layers sealed between two electrodes, including a hole injection/transport layer (HITL), an electron-emitting layer (EML) and an electron-transporting layer (ETL). Package configurations allow each layer to be optimized individually for charge injection, transport and emission.

Currently developed polymer materials for the hole injection/transport layer (HITL) can mainly be divided into two types based on chemical bonds formed therein, i.e. ionic bond and covalent bond.

Poly(3,4-ethylenedioxythiophene)-poly(styrenesulfonate) (abbreviated as PEDOT-PSS hereinafter) as shown in FIG. 1 is one material formed by ionic bonding. Studies on organic materials possessing high hole-injection have been focused on PEDOT-PSS due to its reasonable ionization potential ($I_p$=−5.2 to −5.3 eV), high conductivity (~1-10 S/cm) and good hole-injection ability. However, PEDOT-PSS is ionic, acidic and fabricated from water dispersion. Water is relatively more destructive than oxygen for OLEDs and PLEDs. Therefore, PEDOT-PSS is not very stable in the LED architecture. Due to the drawbacks of its material characteristics, currently, PEDOT-PSS cannot be effectively used in the process of large-scale coating.

Further, PEDOT-PSS can be used as a conventional organic transistor element. However, PEDOT has a poor orientational property in an electrode and cannot express a sufficient carrier transport property as an electrode material.

Covalently cross-linked hole injection/transport materials (abbreviated as HITM) leading to the formation of solvent-resistant hole-injection layers have also been extensively studied. Varieties of thermally, photochemically and electrochemically cross-linked materials can overcome the interfacial mixing caused by solution processing. For example, thermosetting polymers formed by covalent bonding as shown in FIG. 2 (Adv. Fun. Mater. 2002. 12 745.; Adv. Mater. 2007, 19, 300.; Adv. Mater. 2009, 21, 1972.) have proper molecular energy levels (Highest Occupied Molecular Orbital (HOMO) $I_p$=−5.3 eV) and excellent hole injeciotn capacities. Therefore, electronic elements made from the thermosetting polymers have good efficiency. Although the thermosetting polymers formed by covalent bonding do not have the drawbacks of PEDOT-PSS, the property of the thermosetting polymers makes them lack of workability. In addition, the processes for manufacturing electronic elements by the thermosetting polymers are more complex and harsh (for example, it needs a high temperature of over 200° C. to perform thermal curing). Since the cost for manufacturing electronic elements by the thermosetting polymers is high, the polymers currently are suitable for use in small devices of labs and do not have the potential for highly commercial mass production.

BRIEF SUMMARY OF THE INVENTION

For overcoming many drawbacks of current materials, a novel and cost effective material containing neither ion nor hydrophilic functionality to replace PEDOT-PSS and thermosetting polymers has been actively pursued. The inventors, therefore, provide a novel compound that leads to a physically cross-linked structure formed by highly complementary non-covalent bonding and can act as well as the covalently cross-linked materials without additional processes.

In one aspect, the present invention provides a compound of formula I

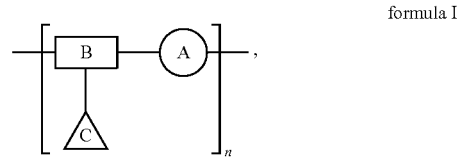

formula I wherein A, B and C are a repeating unit; each of A and B is an optionally substituted group for forming a conjugated polymer; C is a crosslinkable group; and n is an integer equal to or greater than 1.

Another aspect of the present invention is a compound of formula I, wherein A and B are the same or different and each of them is one independently selected from the group consisting of optionally substituted triphenylamine, optionally substituted carbazole, optionally substituted thiophene, optionally substituted fluorene, optionally substituted p-phenylene vinylene and a combination thereof; C is one selected from the group consisting of an amide-containing group, a carboxyl-containing group, a hydroxyl-containing group, an amino-containing group, a halogen-containing group, a base-containing group, and a combination thereof; and a substituent for A or B is one independently selected from the group consisting of $C_{1-15}$ alkyl and $C_{6-10}$ aryl.

According to the present invention, the examples of the base-containing group may include adenine, thymine, cytosine, guanine, uracil, a combination thereof and the like. Preferably, the base-containing group is adenine or uracil. In addition, the examples of C may be

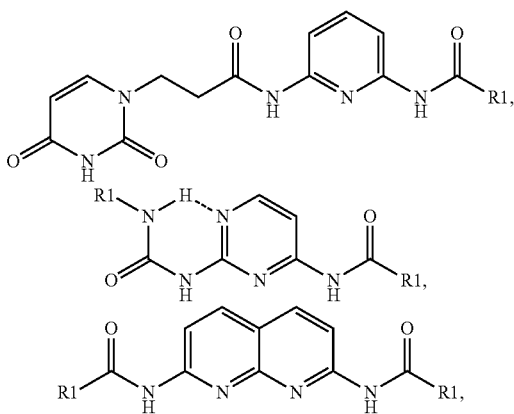

-continued

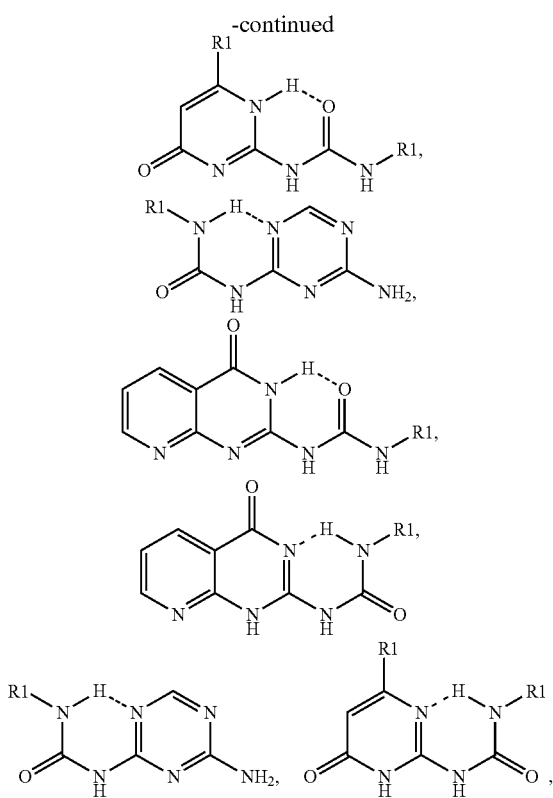

a combination thereof etc. and a substituent for R1 may be $C_{1-15}$ alkyl or $C_{6-10}$ aryl.

In a further aspect, the present invention provides a compound of formula I, wherein A is optionally substituted triphenylamine, B is optionally substituted carbazole and a substituent for A and B is butyl.

In another aspect, the present invention provides a compound of formula I, provided that when C is the crosslinkable group, both A and B are not thiophene, fluorene or p-phenylene vinylene at the same time; when C is the crosslinkable group, A and B are different; when both A and B are optionally substituted carbazole at the same time, C is not guanine; or when A is optionally substituted fluorene and B is optionally substituted carbazole, C is not guanine.

In one embodiment of the compound of formula I of the present invention, the repeating unit is 1-[4-(3-{4-[(4-butylphenyl)(phenyl)amino]phenyl}-9H-carbazol-9-yl)butyl]-1,2,3,4-tetra hydropyrimidine-2,4-dione;

9-[4-(3-{4-[(4-butylphenyl)(phenyl)amino]phenyl}-9H-carbazol-9-yl)butyl]-9H-purin-6-amine;

1-[4-(3-{4-[(4-butylphenyl)(phenyl)amino]phenyl}-9H-carbazol-9-yl)butyl]-5-methyl-1,2,3,4-tetrahydropyrimidine-2,4-dione;

4-amino-1-[4-(3-{4-[(4-butylphenyl)(phenyl)amino]phenyl}-9H-carbazol-9-yl)butyl]-1,2-dihydropyrimidin-2-one; or 2-amino-9-[4-(3-{4-[(4-butylphenyl)(phenyl)amino]phenyl}-9H-carbazol-9-yl)butyl]-6,9-dihydro-1H-purin-6-one.

In another aspect of the present invention, a conductive film including any one of the aforementioned compounds is provided.

In still another aspect of the present invention, a carrier transport layer including any one of the aforementioned compounds is provided. Preferably, the carrier transport layer may be a hole transport layer.

In yet another aspect of the present invention, an electronic device is provided, wherein a conductive film is included and the conductive film includes any one of the aforementioned compounds.

One aspect of the present invention is to provide an electronic device that includes a carrier transport layer and the carrier transport layer includes any one of the aforementioned compounds. Preferably, the electronic device may be an electroluminescent device or a transistor. More preferably, the electroluminescent device may be a light-emitting diode device. Particularly, the light-emitting diode device may be an organic light-emitting diode device.

In another aspect of the present invention, a solar cell is provided, wherein a carrier transport layer is included and the carrier transport layer includes any one of the aforementioned compounds.

In another aspect of the present invention, a light detector is provided, wherein a carrier transport layer is included and the carrier transport layer includes any one of the aforementioned compounds.

In a further aspect, the present invention provides a method for manufacturing an electronic element that includes a layer formed by using any one of the aforementioned compounds. Preferably, the layer may be a film.

In another aspect of the present invention, a method for manufacturing an electronic device is provided, wherein the method includes the step of using any one of the aforementioned compounds. The examples of the electronic device may be an electroluminescent device or a transistor. Preferably, the electroluminescent device may be a light-emitting diode device. More preferably, the light-emitting diode device may be an organic light-emitting diode device.

Since the compound of the present invention is not a polymer formed by ionic bonding, it has excellent environment stability. The present invention not only has the properties of current hole injection/transport materials, but also can overcome many defects of current techniques. In addition, the process for manufacturing the present invention is easy and the solvent-resistant ability of the element formed by the present invention is enhanced due to the property of the present invention.

DETAILED DESCRIPTION OF THE INVENTION

Figure 1:
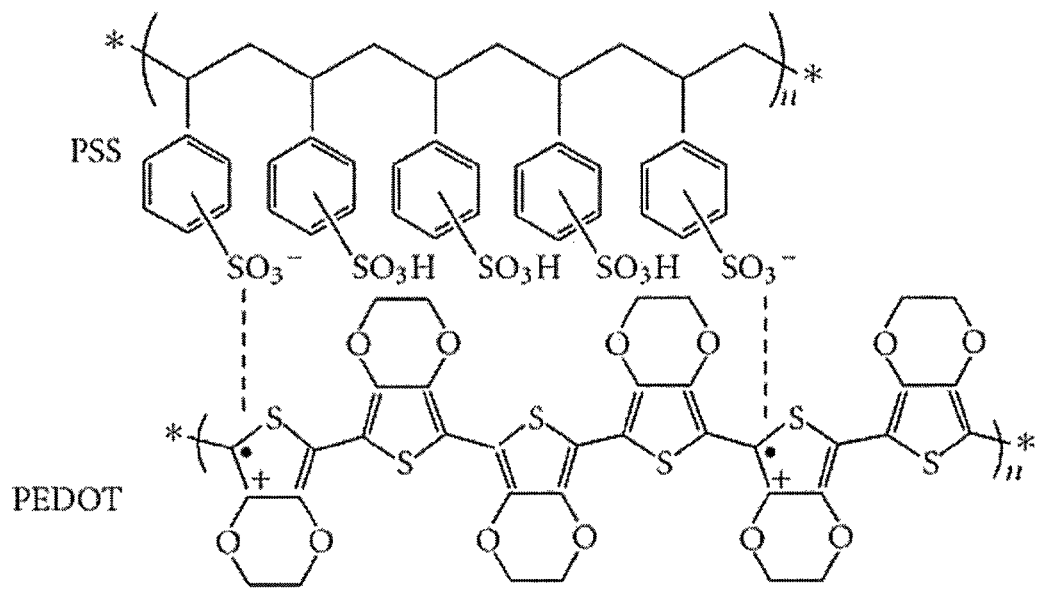
FIG. 1 shows the chemical structure of PEDOT-PSS.
Figure 2:
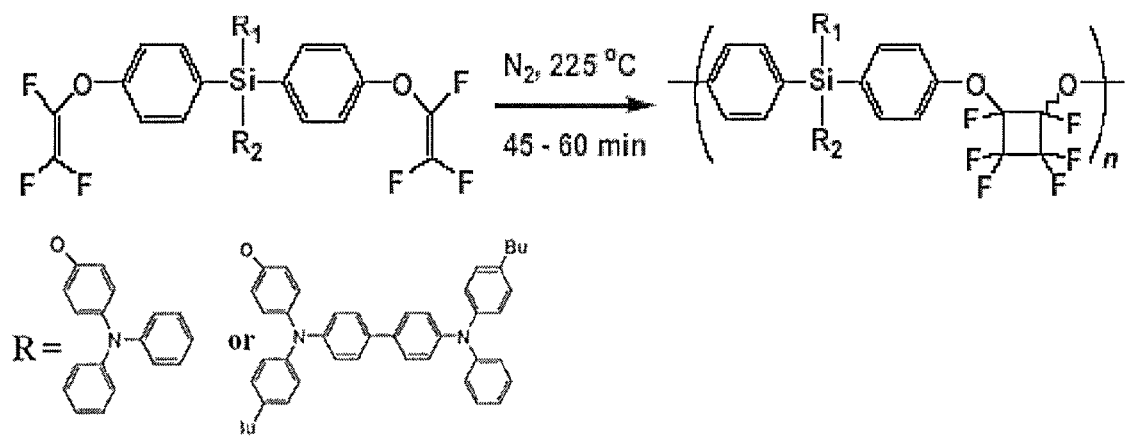
FIG. 2 shows the chemical structure of a thermosetting polymer.

The following illustrative embodiments are provided to illustrate the disclosure of the present invention. These and other advantages and effects of the present invention can be apparently understood by those in the art after reading the disclosure of this specification.

As used herein, the term "conjugated polymer" refers to an intrinsic conductive polymer, in which the main chain of the polymer is formed by means of alternating single and double bonds.

As used herein, the term "crosslinkable group" refers to a group that can form crosslinking by a hydrogen bond. Examples of a crosslinkable group, which can form crosslinking by such a hydrogen bond, may include an amide group, a carboxyl group, a hydroxyl group, an amino group, a halogen-containing group, a base-containing group, etc.

As used herein, the term "halogen" refers to iodine, bromine, chlorine or fluorine.

As used herein, the term "base-containing group" refers to any group including a base. The examples of base may include adenine, cytosine, guanine, uracil, thymine, etc. and the examples of the base-containing group may also include adenine, cytosine, uracil, guanine and thymine.

As used herein, "alkyl" refers to a hydrocarbon chain, typically ranging from about 1 to 15 carbon atoms in length. Such hydrocarbon chains are preferably but not necessarily saturated and may be branched or straight chain, although typically straight chain is preferred. Exemplary alkyl groups may include methyl, ethyl, propyl, butyl, pentyl, 1-methylbutyl, 1-ethylpropyl, 3-methylpentyl, and the like.

As used herein, "aryl" refers to one or more aromatic rings, typically ranging from about 6 to 10 carbon atoms. Aryl may include multiple aryl rings that may be fused, such as naphthyl, or non-fused, such as biphenyl. Aryl rings may also be fused or non-fused with one or more cyclic hydrocarbon, heteroaryl, or heterocyclic rings. Exemplary aryl groups may include phenyl, naphthyl and the like.

As used herein, "hole transport layer (HTL)" refers to an element for facilitating holes transport. For example, when inserting a hole transport layer between indium tin oxide (abbreviated as ITO hereinafter) and an emissive layer, the hole-transport barrier is remarkably reduced to facilitate holes transport. Moreover, a gap state in the band gap of HTL is found to further improve holes injection at the interface. This phenomenon can explain why an electroluminescent device (especially OLED devices) having HTL shows improved performance. Examples of the material used for a hole transport layer may include triphenyl diamine (TPD), N,N-bis(naphthalen-1-yl)-N,N-bis(phenyl)benzidine (NPB, Kodak), polyvinylcarbazole (PVK), Spiro-TPD (Covion), Spiro-NPB (Covion) and the like.

EXAMPLE 1

Synthesis of 4-butyl-N,N-bis(4-bromophenyl)aniline (compound 1)

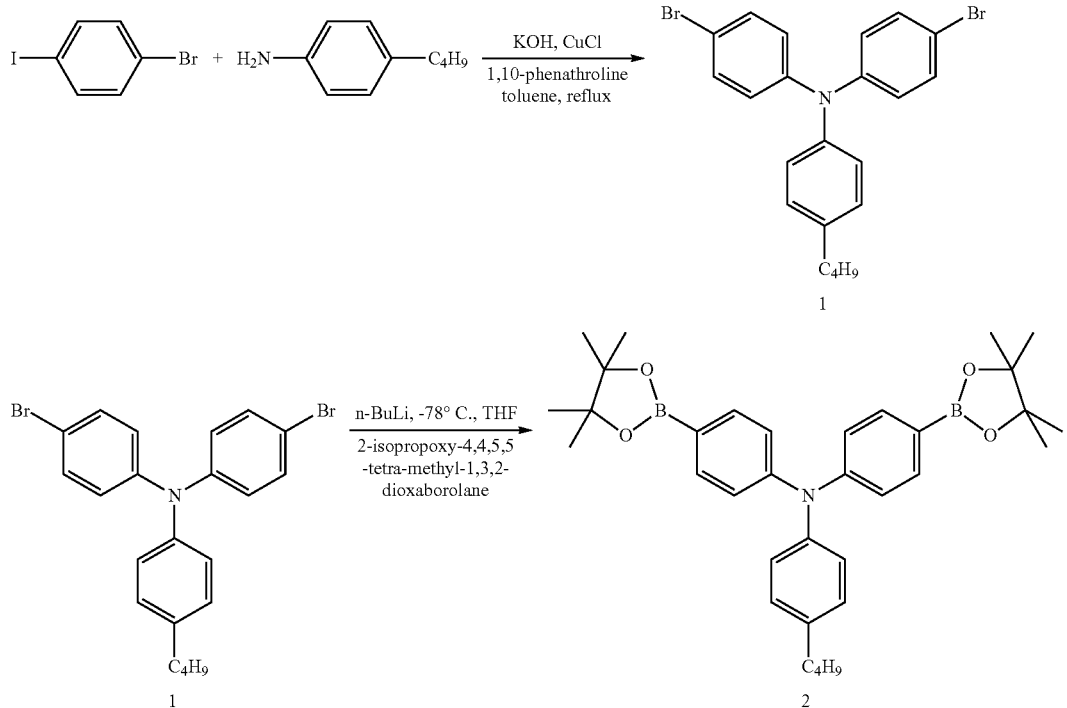

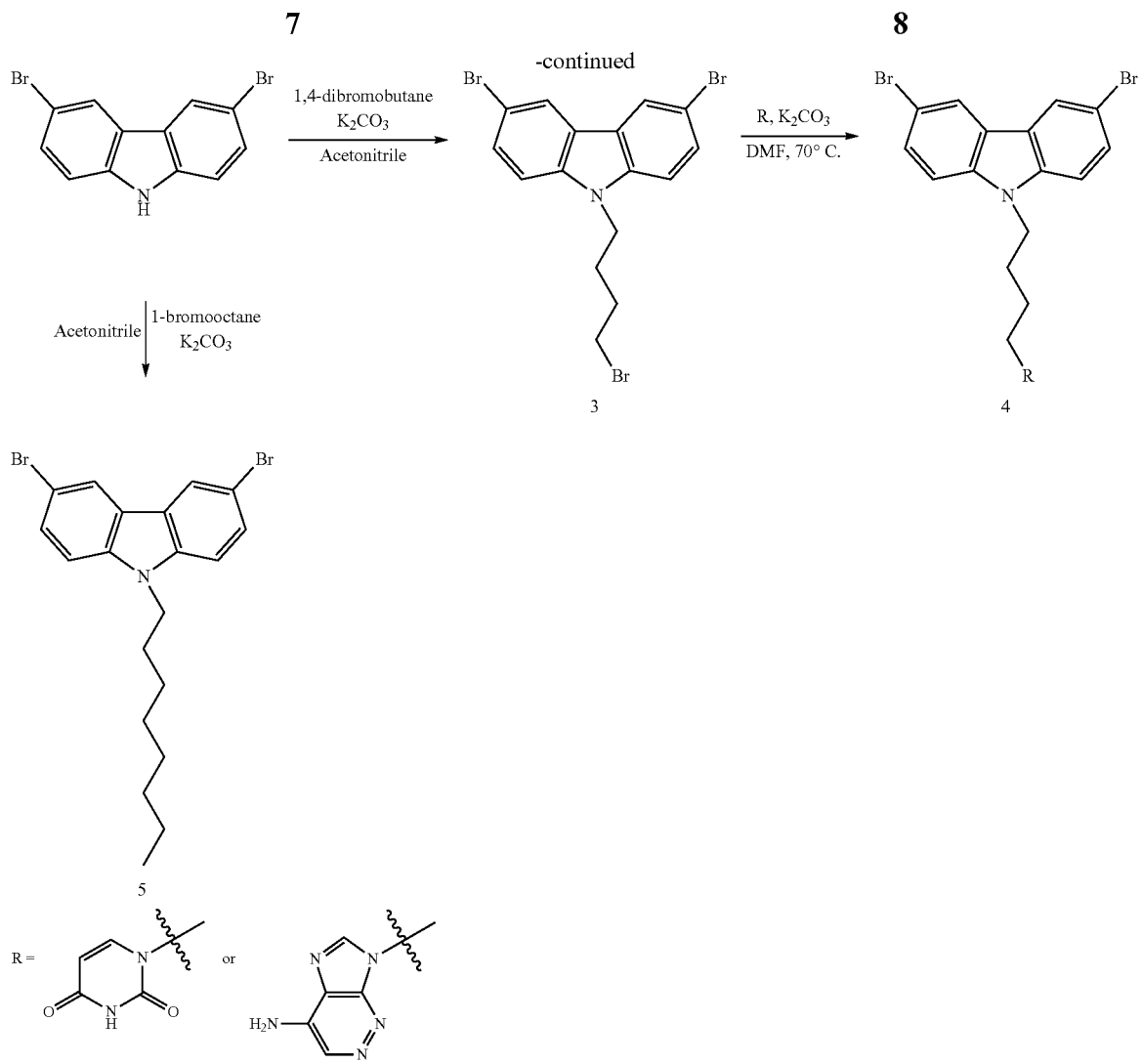

As shown in scheme 1, toluene (50 ml), butyl-aniline (4.23 mL, 26.8 mmol), 1-bromo-4-iodobenzene (16.68 g, 59 mmol), 1,10-phenanthroline (0.18 g, 0.97 mmol), cuprous chloride (CuCl) (0.1 g, 0.95 mmol) and potassium hydroxide (KOH) (13.67 g, 243 mmol) were added sequentially to a 250 ml three-necked flask equipped with condenser, magnetic stirrer, nitrogen inlet and outlet under nitrogen. The reaction mixture was heated to reflux in 30 min and was stirred at reflux for 48 h. Then, the mixture was cooled to 75° C., and 100 ml of toluene and 100 ml of distilled water were used in extraction. The toluene phase was separated, dried with anhydrous magnesium sulfate (MgSO$_4$), filtered and vacuum distilled. The crude product was purified by silica column chromatography using toluene as eluent to give colorless oil (3.8 g, 31%).

$^1$H NMR (300 MHz, CDCl$_3$, δ): 7.30 (dd, 4H; Ar H), 7.07 (d, 2H; Ar H), 6.96 (d, 2H; Ar H), 6.90 (dd, 4H; Ar H), 2.56 (t, 2H; CH$_2$), 1.63-1.52 (m, 2H; CH$_2$), 1.41-1.29 (m, 2H; CH$_2$), 0.93 (t, 3H; CH$_3$).

$^{13}$C NMR (300 MHz, CDCl$_3$, δ): 146.7, 144.4, 138.8, 132.2, 129.4, 125.0, 114.9, 35.0, 33.6, 22.4, 14.0.

HRMS (ESI, m/z): [M+H]$^+$ calcd for C$_{22}$H$_{21}$NBr$_2$, 457.0041. found, 457.0039.

EXAMPLE 2

Synthesis of 4-butyl-N,N-bis(4,4,5,5-tetramethyl-1,3,2-dioxaborolane-4-phenyl)-aniline (compound 2)

As shown in scheme 1, to a solution of 4-butyl-N,N-bis(4-bromophenyl)-aniline (2.02 g, 4.4 mmol) in anhydrous tetrahydrofuran (THF, 44 mL) at −78° C. was added n-butyl lithium (n-BuLi, 4.4 mL, 11.1 mmol, 2.5 M in hexane). The mixture was stirred at −78° C. for 45 min. 2-isopropoxy-4,4,5,5-tetramethyl-1,3,2-dioxaborolane (2.7 mL, 13.2 mmol) was added rapidly to the solution. The mixture was stirred for 2 h at −78° C. The mixture was poured into water and extracted with diethyl ether. The organic extracts were combined and washed with brine. The solvent was removed under reduced pressure, and the crude product was purified by recrystallization from methanol to get colorless crystals (1.36 g, 56%, mp: 204-206° C.).

$^1$H NMR (300 MHz, CDCl$_3$, δ): 7.64 (d, 4H; Ar H), 7.03 (m, 8H; Ar H), 2.56 (t, 2H; CH$_2$), 1.63-1.53 (m, 2H; CH$_2$), 1.38-1.31 (m, 26H; CH$_2$ and C$_8$H$_{24}$), 0.92 (t, 3H; CH$_3$).

$^{13}$C NMR (300 MHz, CDCl$_3$, δ): 150.5, 144.7, 139.0, 135.9, 129.4, 126.2, 122.7, 83.8, 35.3, 33.9, 24.9, 22.5, 14.3.

HRMS (ESI, m/z): [M+H]$^+$ calcd for C$_{34}$H$_{45}$B$_2$NO$_4$, 553.3534. found, 553.3539.

EXAMPLE 3

Synthesis of 4-bromobutyl-9(3,6-dibromocarbazole) (compound 3)

As shown in scheme 1, the following reagents were placed in a reaction flask fitted with a condenser: product 3,6-dibromo-9H-carbazole (6.5 g, 0.02 mol), powdered anhydrous potassium carbonate (5.53 g, 0.04 mol), anhydrous acetonitrile (80 mL) and 1,4-diromobutane (25 mL, 0.2 mol). The reaction vessel was purged with argon and this atmosphere was maintained throughout the reaction. The reaction mixture was stirred and heated at reflux in an oil bath at 95° C. for 36 h. Finally, the reaction mixture was filtered, the solvent was evaporated, and the residue was recrystallized from petroleum ether to give crystals (6.9 g, 75%).

$^1$H NMR (300 MHz, CDCl$_3$, δ): 8.10 (d, 2H; Ar H), 7.54 (dd, 2H; Ar H), 7.25 (d, 2H; Ar H), 4.25 (t, 2H; CH$_2$), 3.36 (t, 2H; CH$_2$), 2.04-1.95 (m, 2H; CH$_2$), 1.89-1.80 (m, 2H; CH$_2$).

$^{13}$C NMR (300 MHz, CDCl$_3$, δ): 134.4, 124.4, 118.9, 107.6, 105.8, 37.8, 28.4, 25.5, 22.9.

EXAMPLE 4

Synthesis of 4-uracilbutyl-9 (3,6-dibromocarbazole) (compound 4, R=uracil)

As shown in scheme 1, the following reagents were placed in a reaction flask fitted with a condenser: 4-bromobutyl-9(3,6-dibromocarbazole) (1.0 g, 2.17 mmol), powdered anhydrous potassium carbonate (0.45 g, 3.25 mmol), dimethyl fumarate (DMF, 20 mL) and uracil (0.3653 g, 3.26 mmol). The reaction vessel was purged with argon and this atmosphere was maintained throughout the reaction. The reaction mixture was stirred and heated at reflux in an oil bath at 70° C. for 72 h. Finally, the reaction mixture was filtered, the solvent was evaporated, and the solid was washed several times with water. The solid was collected by filtration and recrystallized from toluene to give crystals (0.54 g, 51%, mp: 190° C.).

$^1$H NMR (300 MHz, DMSO, δ): 11.2 (s, 1H; NH), 7.63 (d, 2H; Ar H), 7.60-7.54 (m, 5H; Ar H), 5.49 (d, 1H; Ar H), 4.39 (t, 2H; CH$_2$), 3.63 (t, 2H; CH$_2$), 1.69 (m, 2H; CH$_2$), 1.58 (m, 2H; CH$_2$).

$^{13}$C NMR (300 MHz, DMSO, δ): 164.3, 151.6, 146.1, 139.6, 129.6, 124.1, 123.4, 112.3, 112.0, 101.7, 47.7, 42.9, 26.7, 26.0.

HRMS (ESI, m/z): [M+H]$^+$ calcd for C$_{20}$H$_{17}$Br$_2$N$_3$O$_2$, 491.18. found, 491.

E$_{LEM}$. Anal. calcd for C$_{20}$H$_{17}$Br$_2$N$_3$O$_2$: C, 48.91; H, 3.49; N, 8.56. Found: C, 49.98; H, 3.91; N, 8.56.

EXAMPLE 5

Synthesis of 4-adeninebutyl-9 (3,6-dibromocarbazole) (compound 4, R=adenine)

As shown in scheme 1, the following reagents were placed in a reaction flask fitted with a condenser: 4-bromobutyl-9(3,6-dibromocarbazole) (1.0 g, 2.17 mmol), powdered anhydrous potassium carbonate (0.66 g, 4.77 mmol), anhydrous N,N-dimethylformamide (20 mL) and adenine (0.44 g, 3.255 mmol). The reaction vessel was purged with argon and this atmosphere was maintained throughout the reaction. The reaction mixture was stirred and heated at reflux in an oil bath at 70° C. for 72 h. Finally, the reaction mixture was filtered, the solvent was evaporated, and the solid was washed several times with water. The solid was collected by filtration and recrystallized from toluene to give crystals (0.59 g, 53%).

$^1$H NMR (300 Hz, DMSO, ppm): 8.43 (s, 2H), 8.11 (s, 1H), 8.04 (s, 1H), 7.55 (s, 2H), 7.21 (d, 4H), 4.36 (t, 2H), 4.12 (t, 2H), 1.78 (m, 2H), 1.69 (m, 2H).

$^{13}$C NMR (300 Hz, DMSO, ppm): 156.7, 153.2, 150.3, 141.3, 139.5, 129.4, 124.1, 123.6, 112.3, 112.0, 43.1, 42.6, 27.8, 26.7.

EXAMPLE 6

Synthesis of 4-octyl-9(3,6-dibromocarbazole) (compound 5)

As shown in scheme 1, the following reagents were placed in a reaction flask fitted with a condenser: 3,6-dibromo-9H-carbazole (6.5 g, 0.02 mol), powdered anhydrous potassium carbonate (5.53 g, 0.04 mol), anhydrous acetonitrile (80 mL) and 1-bromooctane (0.2 mol). The reaction vessel was purged with argon and this atmosphere was maintained throughout the reaction. The reaction mixture was stirred and heated at reflux in an oil bath at 95° C. for 36 h. Finally, the reaction mixture was filtered, the solvent was evaporated, and the residue was recrystallized from petroleum ether to give crystals. (7 g, 80%).

$^1$H NMR (300 MHz, DMSO, δ): 8.07 (d, 2H; Ar H), 7.51 (dd, 2H; Ar H), 7.20 (d, 2H; Ar H), 4.15 (t, 2H; CH$_2$), 1.77 (m, 2H; CH$_2$), 1.20-1.30 (m, 10H; CH$_2$), 0.85 (t, 3H; CH$_3$).

$^{13}$C NMR (300 MHz, CDCl$_3$, δ): 139.6, 129.2, 123.6, 123.4, 112.0, 110.7, 43.6, 31.9, 29.5, 29.3, 29.0, 27.4, 22.9, 14.3.

EXAMPLE 7

Synthesis of 1-[4-(3-{4-[(4-butylphenyl)(phenyl) amino]phenyl}-9H-carbazol-9-yl)butyl]-1,2,3,4-tetra hydropyrimidine-2,4-dione (PTC-U)

Scheme 2

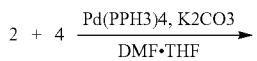

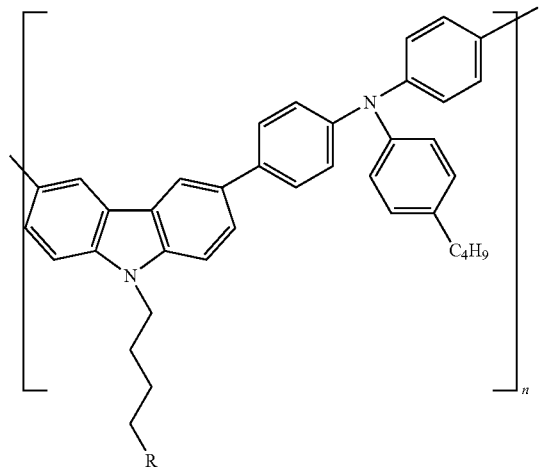

PTC-U & PTC-A

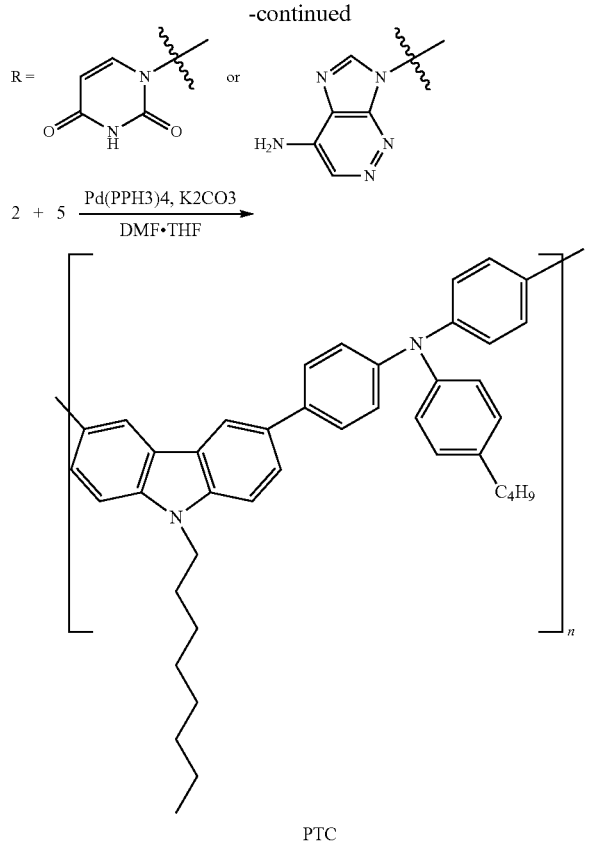

PTC

As shown in scheme 2, to a mixture of 4-uracilbutyl-9(3,6-dibromocarbazole) (0.75 g, 1.5 mmol), 4-butyl-N,N-bis(4,4,5,5-tetramethyl-1,3,2-dioxaborolane-4-phenyl)-aniline (0.82 g, 1.5 mmol), and freshly prepared Pd(0)(PPh$_3$)$_4$ (0.18 g) was added a deoxygenated mixture of THF (6 mL), DMF (6 mL) and aqueous 2M K$_2$CO$_3$ (8 mL). The mixture was vigorously stirred at 85-90° C. for 48-72 h. After the solution was cooled, the whole mixture was poured slowly into a cold mixture of methanol/deionized water (10/1 in volume). The polymer was collected by filtration and washed with methanol. The solid was then washed for 24 h in a Soxhlet apparatus using acetone to remove oligomers and catalyst residues. The title compound was further purified by redissolving in DMF and then precipitated from cold methanol prior to drying at room temperature under high vacuum.

$^1$H NMR (300 MHz, DMSO-d$_6$, δ): 11.2 (br, NH), 8.54 (br, ArCH), 7.67 (br, ArCH and CH), 7.06 (br, ArCH), 5.48 (br, CH), 4.40 (br, CH$_2$), 3.63 (br, CH$_2$), 2.52 (br, CH$_2$), 1.73 (br, CH$_2$), 1.63 (br, CH$_2$), 1.51 (br, CH$_2$), 1.26 (br, CH$_2$), 0.86 (br, CH$_2$).

EXAMPLE 8

Synthesis of 9-[4-(3-{4-[(4-butylphenyl)(phenyl)amino]phenyl}-9H-carbazol-9-yl)butyl]-9H-purin-6-amine (PTC-A)

As shown in scheme 2, to a mixture of 4-adeninebutyl-9(3,6-dibromocarbazole) (0.186 g, 0.36 mmol), 4-butyl-N,N-bis(4,4,5,5-tetramethyl-1,3,2-dioxaborolane-4-phenyl)-aniline (0.2 g, 0.36 mmol), and freshly prepared Pd(0)(PPh$_3$)$_4$ (0.041 g, 0.036 mmol) was added a deoxygenated mixture of THF (10 mL), DMF (6 mL) and aqueous 2M K$_2$CO$_3$ (10 mL). The mixture was vigorously stirred at 85-90° C. for 48-72 h. After the solution was cooled, the whole mixture was poured slowly into a cold mixture of methanol/deionized water (3/1 in volume). The polymer was collected by filtration and washed with methanol. The solid was then washed for 24 h in a Soxhlet apparatus using acetone to remove oligomers and catalyst residues. The title compound was further purified by redissolving in DMF and then precipitated from cold methanol prior to drying at room temperature under high vacuum.

$^1$H NMR (300 Hz, DMSO, ppm): 8.56 (br, ArCH), 8.17 (br, ArCH), 7.73 (br, ArCH), 7.18 (br, ArCH & NH2), 4.43 (br, CH2), 4.19 (br, CH2), 3.63 (br, CH2), 1.91 (br, CH2), 1.81 (br, CH2), 1.54 (br, CH2), 1.29 (br, CH2), 0.89 (br, CH3).

COMPARATIVE EXAMPLE 1

Synthesis of N-(4-butylphenyl)-4-(9-octyl-9H-carbazol-3-yl)-N-phenylaniline (PTC)

As shown in scheme 2, to a mixture of 4-octyl-9(3,6-dibromocarbazole) (0.753 g, 1.5 mmol), 4-butyl-N,N-bis(4,4,5,5-tetramethyl-1,3,2-dioxaborolane-4-phenyl)-aniline (0.82 g, 1.5 mmol), and freshly prepared Pd(0)(PPh$_3$)$_4$ (0.041 g, 0.036 mmol) was added a deoxygenated mixture of THF (10 mL), DMF (10 mL) and aqueous 2M K$_2$CO$_3$ (10 mL). The mixture was vigorously stirred at 85-90° C. for 48-72 h. After the solution was cooled, the whole mixture was poured slowly into a cold mixture of methanol/deionized water (3/1 in volume). The polymer was collected by filtration and washed with methanol. The solid was then washed for 24 h in a Soxhlet apparatus using acetone to remove oligomers and catalyst residues. The title compound was further purified by redissolving in DMF and then precipitated from cold methanol prior to drying at room temperature under high vacuum.

$^1$H NMR (300 Hz, CDCl$_3$, ppm): 8.32 (br, NH), 7.68-7.11 (br, ArCH), 4.31 (br, CH), 2.55 (br, CH$_2$), 1.88 (br, CH$_2$), 1.56 (br, CH$_2$), 1.30 (br, CH$_2$), 0.89 (br, CH$_2$).

EXAMPLE 9

Gel Permeation Chromatography (GPC) Measurement

To compare the properties of three different materials, PTC, PTC-U and PTC-A, firstly, the effects caused by their molecular weights were eliminated by controlling the number-average molecular weights (Mn) of these three materials between 5000 and 6500, so that the effects caused by side chains were observed in the following examples. Through GPC measurements, the molecular weights of three materials, PTC, PTC-U and PTC-A, relative to that of a standard (polystyrene) were obtained. The eluent used herein was THF or DMF. The results are shown in Table 1.

TABLE 1

| | Physical Property | | | | | |
| Material | Mn | Mw | PDI | Repeating Unit | Td (° C.) | Tg (° C.) |
| --- | --- | --- | --- | --- | --- | --- |
| PTC | 6420 | 12064 | 1.88 | 11 | 420 | 150 |
| PTC-U | 5089 | 6868 | 1.35 | 8 | 380 | 173 |
| PTC-A | 5000 | 8000 | 1.6 | 8 | 405 | 192 |

In the following Examples 10 and 11, PTC, PTC-U and PTC-A represent PTC with 11 repeating units, PTC-U with 8 repeating units and PTC-A with 8 repeating units, respectively.

EXAMPLE 10

Fourier Transform Infrared Spectroscopy

Figure 3:
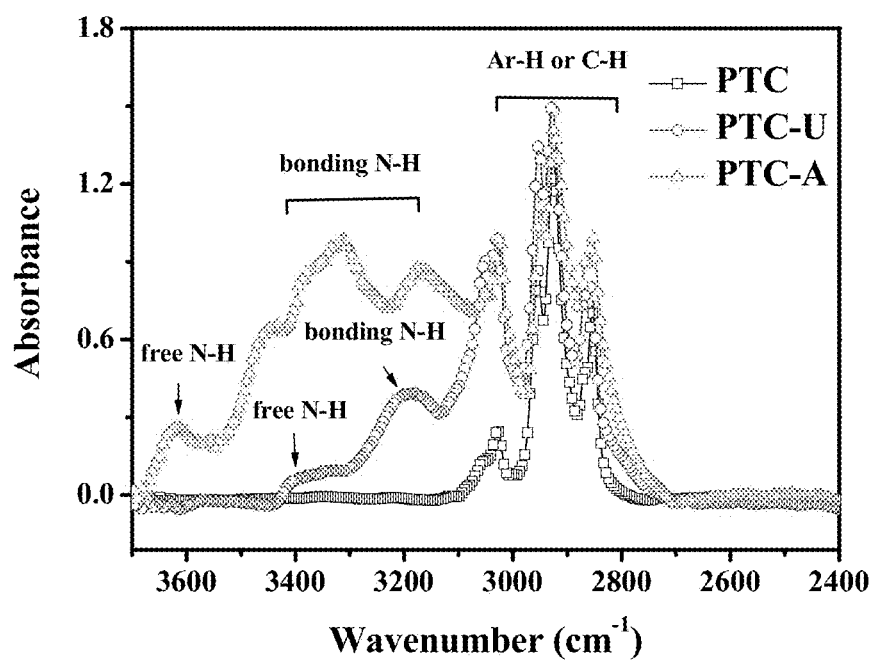
FIG. 3 shows the FTIR spectrogram of PTC, PTC-A and PTC-U (2400~3700 cm$^{-1}$)

To verify the formation of hydrogen bonds of three different materials, PTC, PTC-U and PTC-A, they were dissolved in DMF, cast onto KBr disks, and dried under vacuum at 70° C., respectively. $^1H$ and $^{13}C$ spectra were recorded using Varian UNITY INOVA 500 MHz and Varian UNITY 300 MHz spectrometers. The FTIR spectra for the three materials are shown in FIG. 3. For PTC, there were not any peak values shown in the range of 3100 and 3700 $cm^{-1}$, suggesting that PTC did not contain any N—H bonds. However, for PTC-U, one peak value at around 3400 $cm^{-1}$ showed free N—H stretch vibration of uracil and one peak value at around 3200 $cm^{-1}$ showed bonding N—H stretch vibration of uracil, suggesting that hydrogen bonds did exist in PTC-U. Likewise, for PTC-A, one peak value at around 3600 $cm^{-1}$ showed free N—H stretch vibration of adenine and peak values between 3180 and 3450 $cm^{-1}$ showed bonding N—H stretch vibration of adenine, suggesting that hydrogen bonds did exist in PTC-A.

Figure 4:
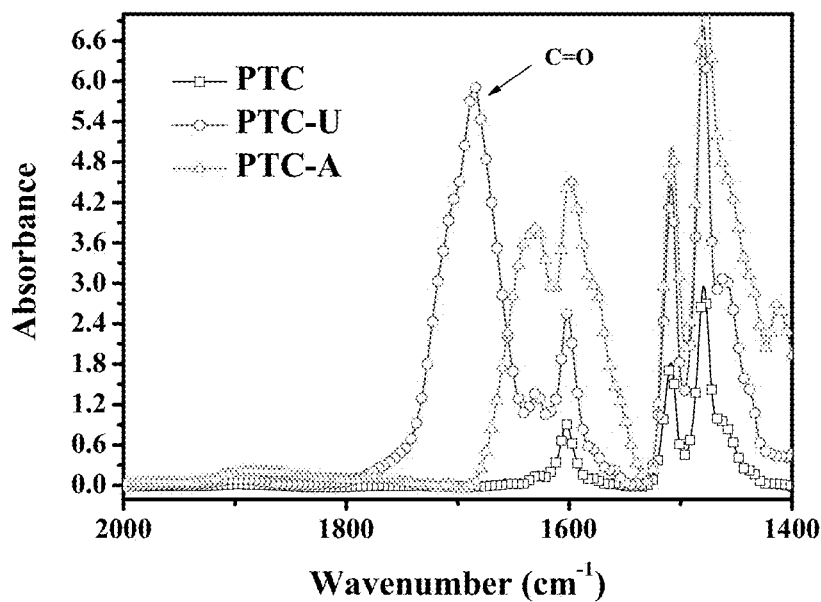
FIG. 4 shows the FTIR spectrogram of PTC, PTC-A and PTC-U (1400~2000 cm$^{-1}$)

As shown in FIG. 4, for PTC-U, one peak value at around 1750 $cm^{-1}$ showed C═O stretch vibration of uracil. The FTIR spectra together with the NMR spectra showed the differences among PTC, PTC-A and PTC-U and demonstrated that the materials were synthesized as expected.

EXAMPLE 11

Thermal Property

In the application of OLEDs, an element must have a good thermal property and thermal stability. Therefore, a high thermal decompose temperature (Td) and a high glass transition temperature (Tg) are desired properties for a good material.

In this example, Thermal Gravimetric Analyzer (TGA) and Differential Scanning calorimeter (DSC) were used to obtain the thermal properties of PTC, PTC-A and PTC-U.

Figure 5:
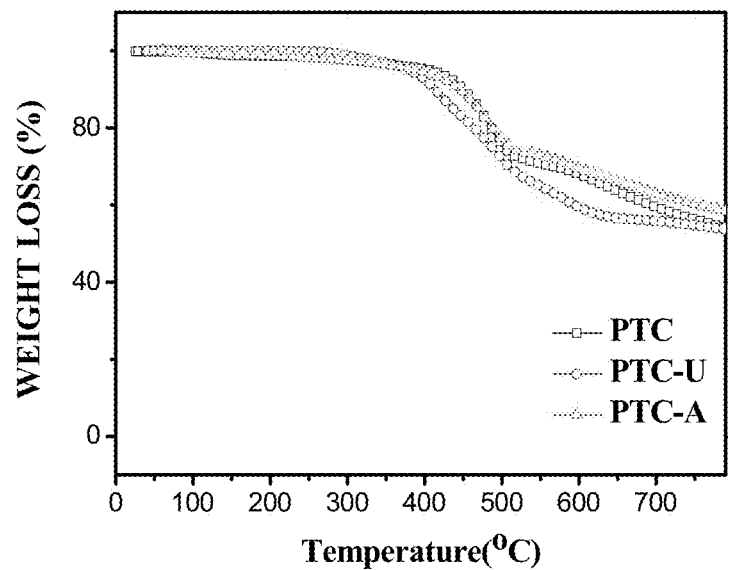
FIG. 5 shows the TGA diagram of PTC, PTC-A and PTC-U.

As shown in FIG. 5 and Table 1, it can be seen that all of PTC, PTC-A and PTC-U had Td of over 350° C., suggesting that they could sustain high temperatures without decomposition during operations.

Figure 6:
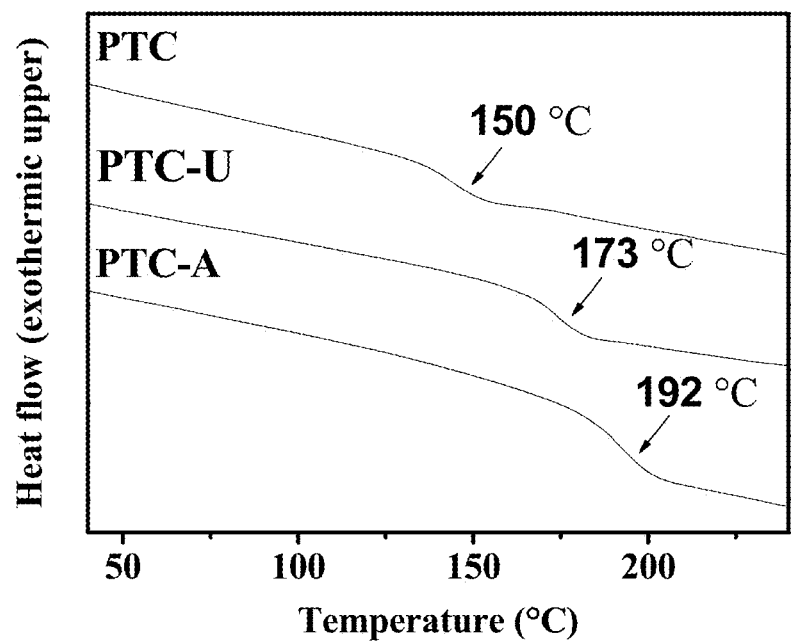
FIG. 6 shows the DSC diagram of PTC, PTC-A and PTC-U.

As shown in FIG. 6 and Table 1, it can be seen that the Tg of PTC-U was 20° C. higher than that of PTC because of the physical crosslinking by hydrogen bonds, and the Tg of PTC-A was 40° C. higher than that of PTC because of stronger hydrogen bonding, suggesting that PTC-U and PTC-A had better thermal stability.

EXAMPLE 12

Solvent-Resistant Ability

The manufacture of elements by polymers is usually conducted by wet processes. Therefore, solvent-resistant ability is crucial for polymers, which are usually used in the manufacture of multiple layers. This example demonstrates that the solvent-resistant ability of the present invention.

Figure 7:
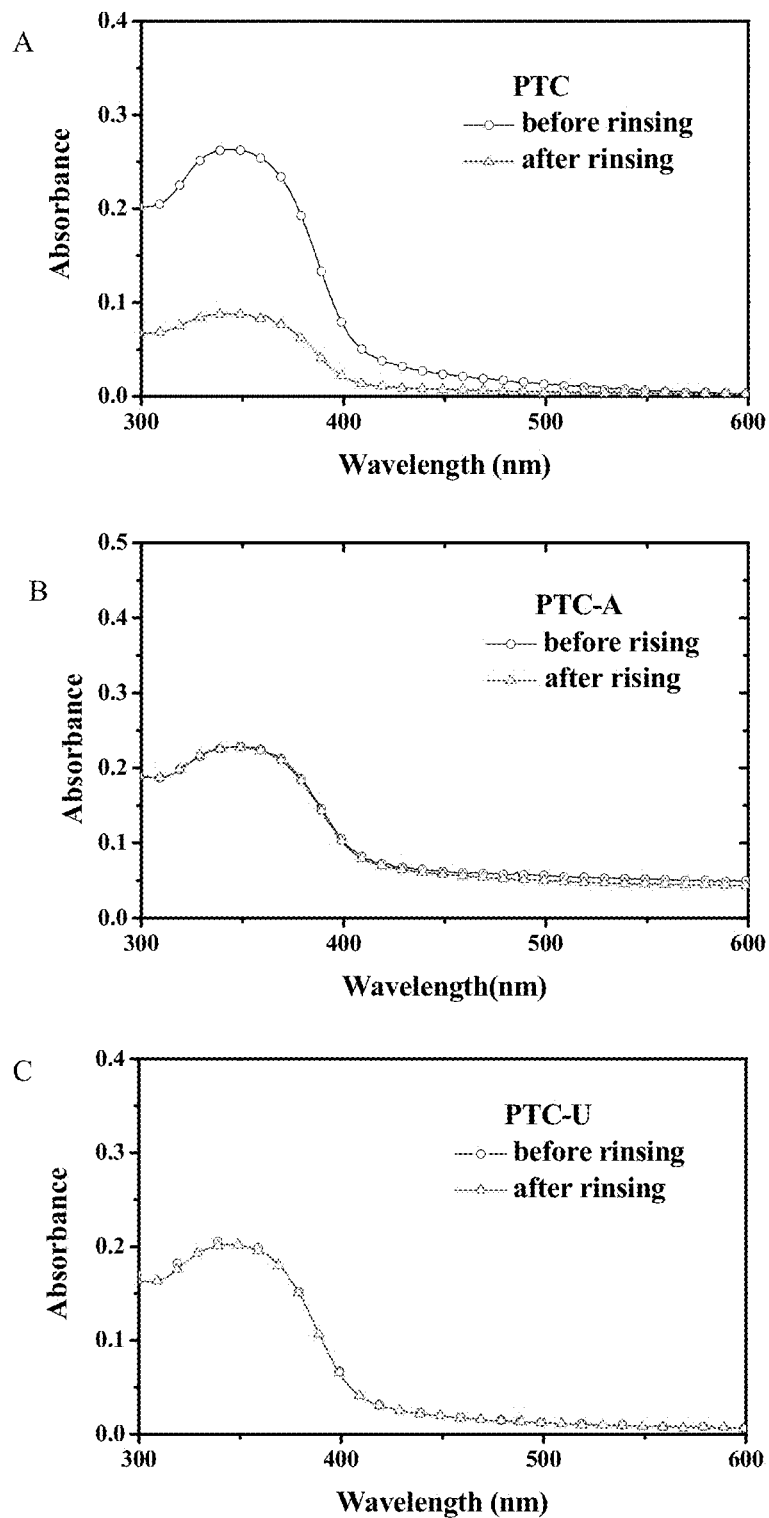
FIGS. 7A-7C show the solvent resistant abilities of PTC, PTC-A and PTC-U, respectively.

PTC, PTC-U and PTC-A were separately applied on quartz glass substrates by spin coating to form thin films. Those thin films were measured by a UV-vis spectrophotometer before and after toluene were used to rinse the surfaces of those thin films. As shown in FIG. 7A, the absorbance value of the thin film formed by PTC significantly decreased after the thin film was treated by toluene, suggesting that a part of PTC was dissolved in toluene and left the substrate during rinse. The concentration of PTC decreased, such that the absorbance value of the thin film thereof decreased as well. However, as shown in FIGS. 7B and 7C, the absorbance values for the thin films separately formed by PTC-A and PTC-U before and after toluene treatment almost remained unchanged, suggesting that physical crosslinking caused by hydrogen bonding allowed the polymers hard to be dissolved in general organic solvents. Therefore, thin films formed by PTC-U and PTC-A would not be eroded by solvents during wet processes. Such materials made the wet processes more effective and extend the life time of elements formed using the same.

EXAMPLE 13

Hole Transport

The thin films formed by PTC, PTC-U and PTC-A respectively were determined by cyclic voltammetry (CV) to obtain their HOMO and Lowest Unoccupied Molecular Orbital (LUMO) as shown in Table 2.

TABLE 2

| | | | | | Absorption | | Photoluminescence | |
|---|---|---|---|---|---|---|---|---|
| Thin film | $Eg^a$ (eV) | $E_{ox,onset}^b$ (eV) | $HOMO^c$ (eV) | $LUMO^d$ (eV) | Solution $\lambda_{max}$(nm) | Film $\lambda_{max}$(nm) | Solution$^e$ $\lambda_{max}$(nm) | Film$^e$ $\lambda_{max}$(nm) |
| PTC | 3.08 | 0.4 | −5.2 | −2.12 | 342 | 347 | 425 | 419 |
| PTC-U | 3.06 | 0.36 | −5.16 | −2.1 | 338 | 344 | 427 | 423 |
| PTC-A | 3.03 | 0.33 | −5.13 | −2.1 | 341 | 344 | 424, 506 | 424 |

$^a$Eg (energy gap): obtained from UV-vis spectra (measured in the form of thin film)
$^b$E$_{ox,onset}$: obtained by cyclic voltammetry using ferrocene as a standard
$^c$HOMO = −E$_{ox,onset}$ − 4.8 eV
$^d$LUMO = HOMO + Eg
$^e$Excitation wavelength (λ excitation = 335 nm)

To compare the ability of hole transport, three hole transport only structures of ITO/thin film formed by PTC/NPB/aluminium (abbreviated as Al hereinafter), ITO/thin film formed by PTC-U/NPB/Al and ITO/thin film formed by PTC-A/NPB/Al were constructed and determined to obtain the curves of voltage vs. current. The work function of Al was −4.28 eV and the LUMO of NPB was −2.6 eV, leading to 1.68 eV of the energy level difference between them. Since the energy barrier was so big to prevent electron transport, electrons could not be transported from negative electrode to positive electrode through the thin film formed by PTC, PTC-U or PTC-A. It could be ascertained that the current detected in this example was resulted from hole transport.

Figure 8:
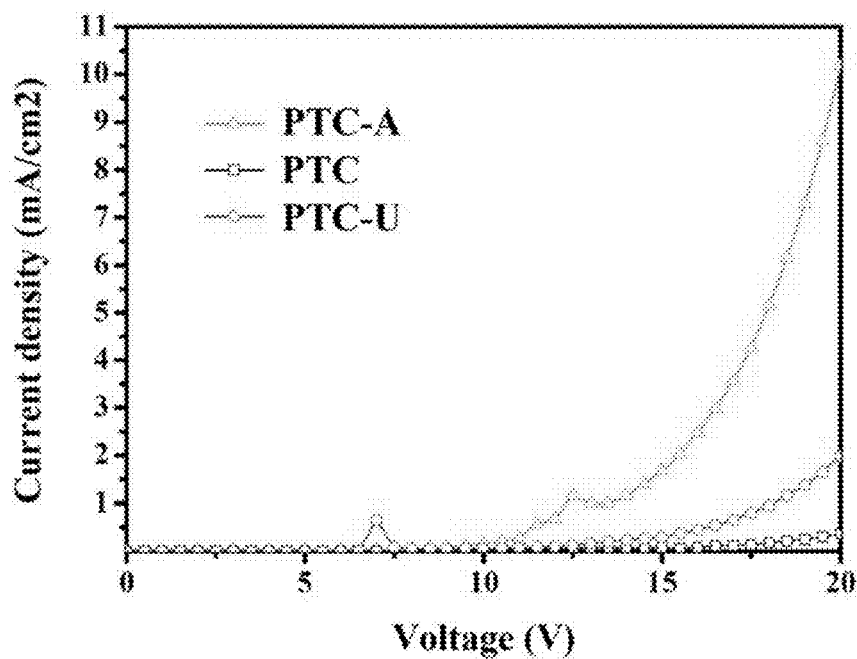
FIG. 8 shows the I-V diagram of the structures with the thin films formed by PTC, PTC-A and PTC-U, respectively.

As shown in FIG. 8, under the same voltage, the current density of the structure with the thin film formed by either PTC-A or PTC-U was high, suggesting that those thin films had better abilities in hole injection and hole transport, compared to those of the thin film formed by PTC. This was because the hydrogen bond formed between adenine-adenine or uracil-uracil allowed holes to effectively transport from one main chain to another main chain nearby. Therefore, the hole transport abilities of the thin films formed by PTC-U and PTC-A, respectively were improved. By the thin film formed by PTC-U or PTC-A, holes could be effectively transported to an emissive layer and allowed a device to emit light rather than dissipating in the form of heat.

EXAMPLE 14

Hole Injection

Figure 9:
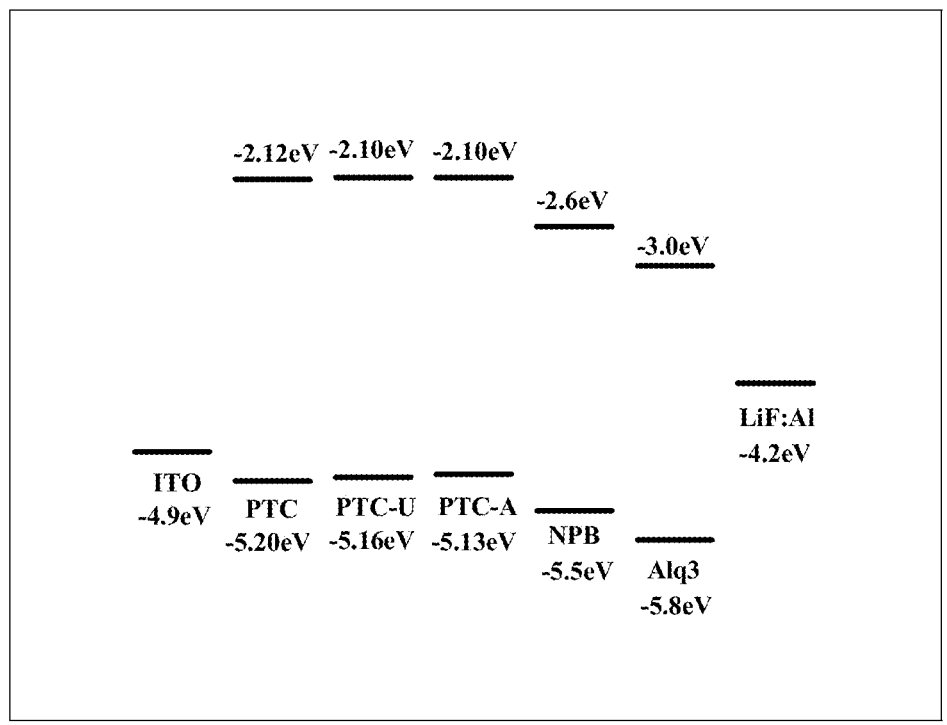
FIG. 9 shows the energy level diagram for different materials.

Based on the HOMO values, the energy level diagram of FIG. 9 was obtained. As shown in FIG. 9, it can be seen that the HOMO values of the thin films formed by PTC-A and PTC-U, respectively were close to the work function of the ITO glass and the energy level differences between the thin film formed by PTC-A and the ITO glass, and between the thin film formed by PTC-U and the ITO glass were only 0.23 eV and 0.26 eV, respectively, compared to 0.3 eV between the thin film formed by PTC and the ITO glass, suggesting that PTC-A and PTC-U were useful in hole injection.

EXAMPLE 15

Element Performance

Three elements having ITO/thin film formed by PTC/NPB/tris-(8-hydroxyquinoline)aluminum (abbreviated as Alq3 hereinafter)/lithium fluoride (abbreviated as LiF hereinafter)/Al, ITO/thin film formed by PTC-A/NPB/Alq3/LiF/Al, and ITO/thin film formed by PTC-U/NPB/Alq3/LiF/Al were constructed and determined, wherein the thin films were spin coated on the surfaces of the ITO glasses and the others were formed by evaporation deposition.

Figure 10:
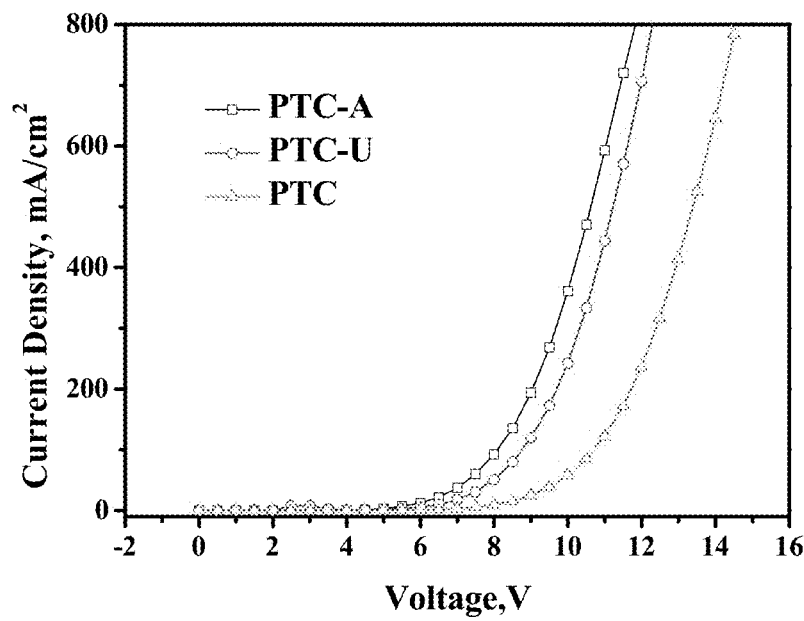
FIG. 10 shows the I-V diagram of the elements with the thin films formed by PTC, PTC-A and PTC-U, respectively.

As shown in FIG. 10, under the same voltage, the elements with the thin films formed by PTC-A and PTC-U, respectively had higher current density, compared to that of the element with the thin film formed by PTC, suggesting that PTC-A and PTC-U had better abilities in hole injection and hole transport.

Figure 11:
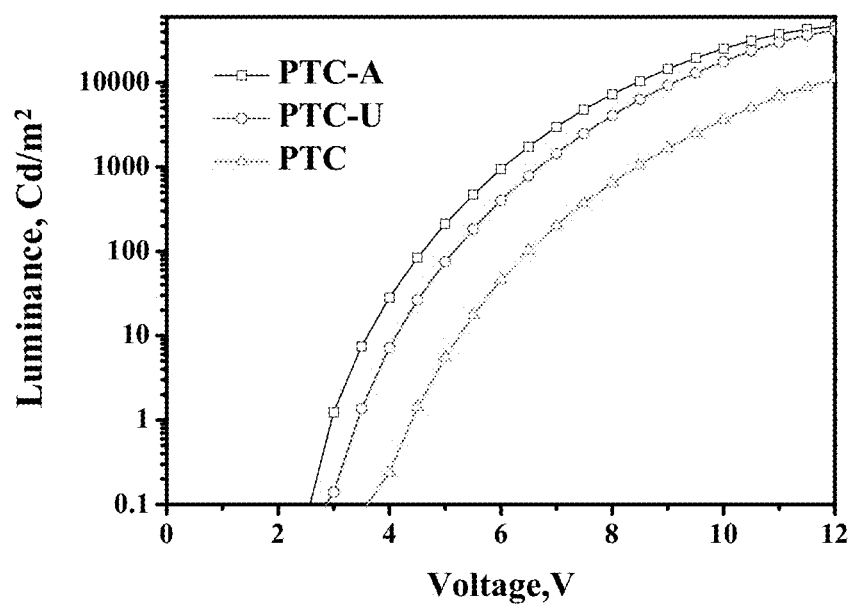
FIG. 11 shows the L-V diagram of the elements with the thin films formed by PTC, PTC-A and PTC-U, respectively.

As shown in FIG. 11, the luminescence performances of the elements with the thin films formed by PTC-A and PTC-U, respectively were better than that of the element with the thin film formed by PTC. This was because the hole injection and hole transport abilities of PTC-A and PTC-U were excellent, leading to more recombination between holes and electrons, such that more light was emitted.

EXAMPLE 16

Performance of OLED Devices

Figure 12:
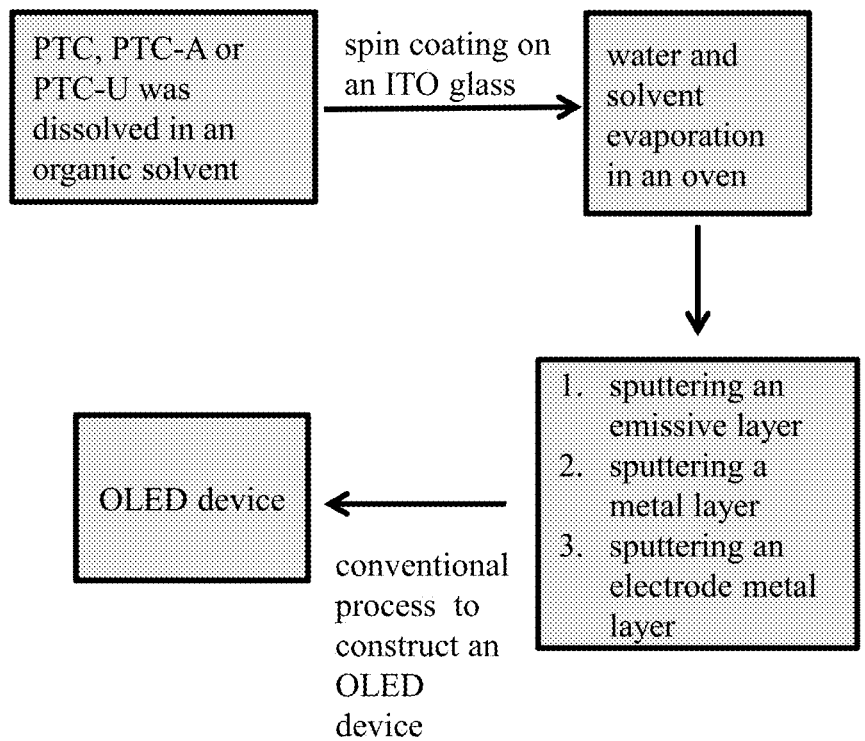
FIG. 12 shows a process for manufacturing a LED device.
Figure 13:
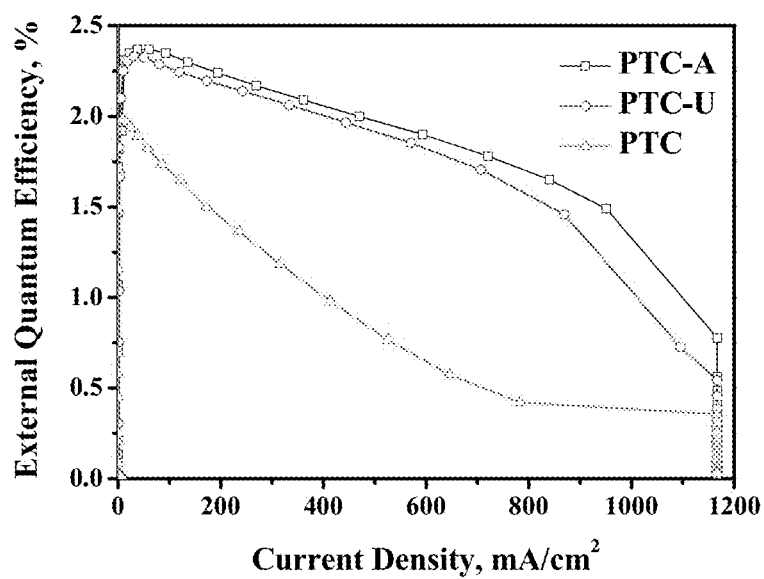
FIG. 13 shows the EQE-V diagram of the OLED devices with the thin films formed by PTC, PTC-A and PTC-U, respectively.
Figure 14:
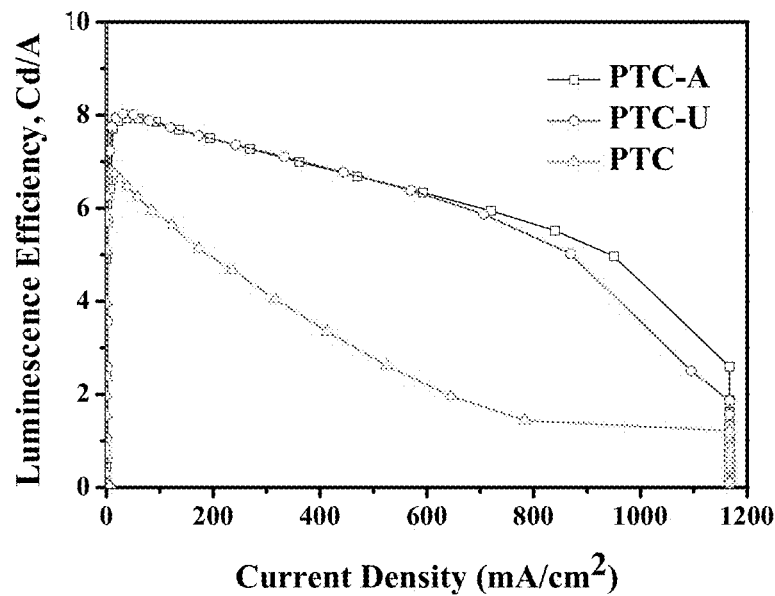
FIG. 14 shows the LE-V diagram of the OLED devices with the thin films formed by PTC, PTC-A and PTC-U, respectively.
Figure 15:
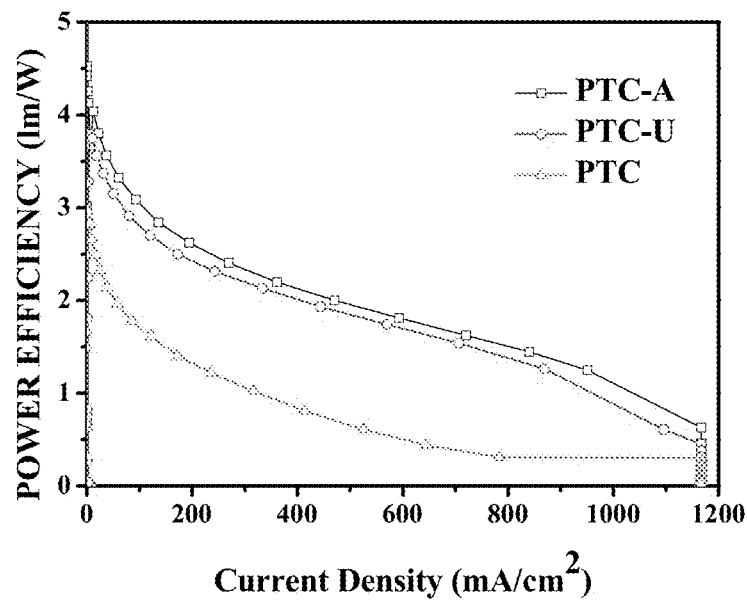
FIG. 15 shows the PE-V diagram of the OLED devices with the thin films formed by PTC, PTC-A and PTC-U, respectively.
Figure 16:
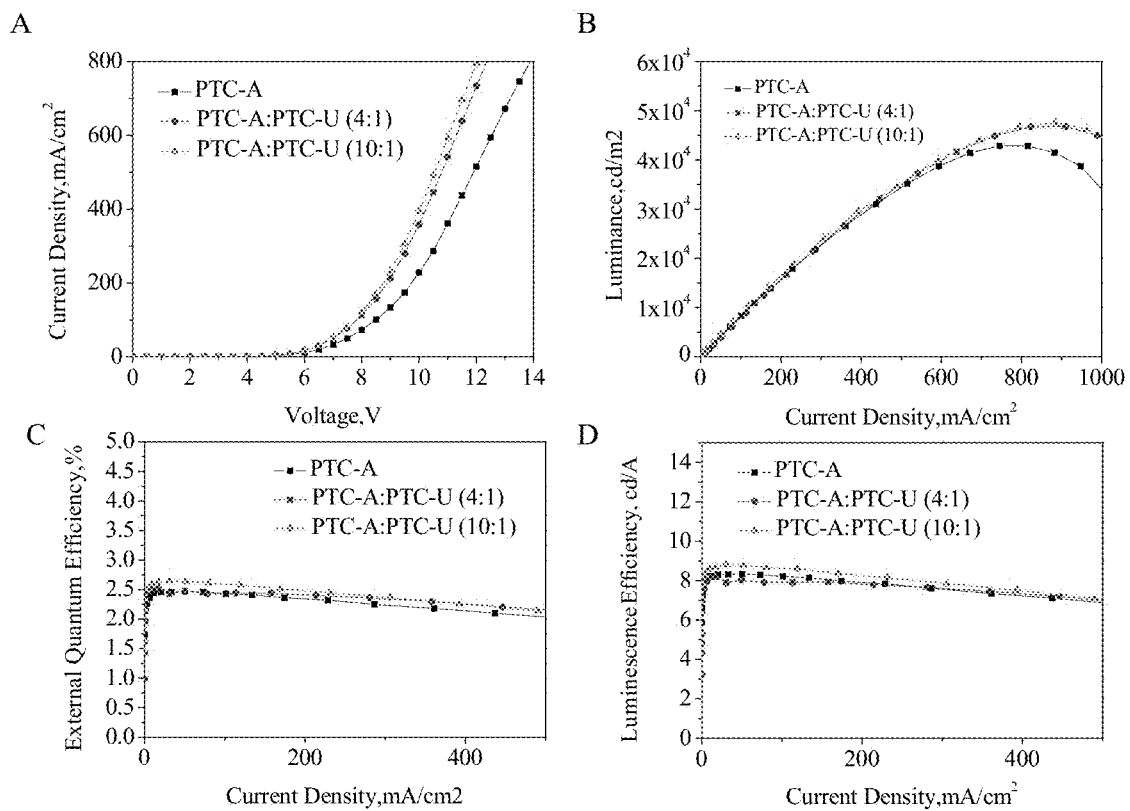
FIGS. 16A-16D show the light performance diagrams of the elements and OLED devices with the thin films formed by PTC-U/PTC-A in ratios of 1:4 and 1:10, respectively.

The present invention may be used in an OLED device, and therefore three devices were constructed based on the structure of ITO/thin film (as shown in Table 3)/NPB/Alq3/LiF/Al by the process shown in FIG. 12. The three OLED devices were evaluated by external quantum efficiency (EQE, a ratio of photons emitted and holes injected at the surface of the device), luminescence efficiency (LE) and power efficiency (PE) to understand the light-emitting performance of those OLED devices. As shown in FIGS. 13-15, it can be seen that the EQEs, LEs and PEs of the OLED devices with the thin films formed by PTC-A and PTC-U, respectively were better than those of the OLED device with the thin film formed by PTC due to improved hole injection and hole transport abilities in the OLED devices with the thin films formed by PTC-A and PTC-U, respectively.

TABLE 3

| | Electroluminescence performance of OLED Device | | | | |
|---|---|---|---|---|---|
| Thin Film | $V_{on}$ (V) | $Q_{max}$ (%) | $LE_{max}$ (cd/A) | $\eta E_{max}$ (lm/W) | $B_{max}$ (cd/m$^2$) |
| PTC | 4.4 | 2 | 6.8 | 3 | 14212 |
| PTC-U | 3.5 | 2.3 | 8 | 3.8 | 43652 |
| PTC-A | 3 | 2.4 | 8 | 4.5 | 47226 |

EXAMPLE 17

Performance of Elements Having Thin Films Formed by PTC-U/PTC-A

Elements having thin films formed by PTC-U/PTC-A (in ratios of 1:4 and 1:10, respectively) were fabricated and OLED devices having the aforementioned elements were further constructed. As shown in FIGS. 16A-16D, it can be seen that the element efficiencies of the elements having thin films formed by PTC-U/PTC-A (in ratios of 1:4 and 1:10, respectively) were further improved, compared to that having the thin film formed by PTC-A only.

The invention has been described by exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A compound of formula I

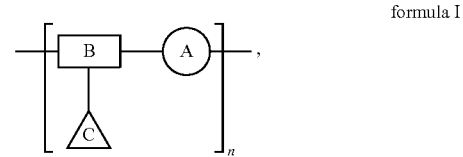

formula I wherein A, B and C are a repeating unit, wherein the repeating unit is:
1-[4-(3-{4-[(4-butylphenyl)(phenyl)amino]phenyl}-9H-carbazol-9-yl)butyl]-1,2,3,4-tetrahydropyrimidine-2,4-dione;
9-[4-(3-{4-[(4-butylphenyl)(phenyl)amino]phenyl}-9H-carbazol-9-yl)butyl]-9H-purin-6-amine;
1-[4-(3-{4-[(4-butylphenyl)(phenyl)amino]phenyl}-9H-carbazol-9-yl)butyl]-5-methyl-1,2,3,4-tetrahydropyrimidine-2,4-dione;
4-amino-1-[4-(3-{4-[(4-butylphenyl)(phenyl)amino]phenyl}-9H-carbazol-9-yl)butyl]-1,2-dihydropyrimidin-2-one; or
2-amino-9-[4-(3-{4-[(4-butylphenyl)(phenyl)amino]phenyl}-9H-carbazol-9-yl)butyl]-6,9-dihydro-1H-purin-6-one;
n is an integer equal to or greater than 1.

2. A conductive film, comprising the compound of formula I according to claim 1.

3. A carrier transport layer, comprising the compound of formula I according to claim 1.

4. The carrier transport layer according to claim 3, wherein the carrier transport layer is a hole transport layer.

5. An electronic device, comprising the conductive film according to claim 2.

6. An electronic device, comprising the carrier transport layer according to claim 3.

7. The electronic device according to claim 6, wherein the electronic device is an electroluminescent device or a transistor.

8. The electronic device according to claim 7, wherein the electroluminescent device is a light-emitting diode.

9. A solar cell, comprising the carrier transport layer according to claim 3.

10. A light detector, comprising the carrier transport layer according to claim 3.

\* \* \* \* \*